United States Patent
Ho et al.

(10) Patent No.: US 11,335,784 B2
(45) Date of Patent: May 17, 2022

(54) FIELD PLATE STRUCTURE FOR HIGH VOLTAGE DEVICE

(71) Applicant: Taiwan Semiconductor Manufacturing Co., Ltd., Hsin-Chu (TW)

(72) Inventors: Chia-Cheng Ho, Hsinchu (TW); Hui-Ting Lu, Zhudong Township (TW); Pei-Lun Wang, Zhubei (TW); Yu-Chang Jong, Hsinchu (TW); Jyun-Guan Jhou, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/952,438

(22) Filed: Nov. 19, 2020

(65) Prior Publication Data
US 2021/0074820 A1   Mar. 11, 2021

Related U.S. Application Data

(62) Division of application No. 16/417,735, filed on May 21, 2019, now Pat. No. 10,861,946.

(51) Int. Cl.
*H01L 29/40* (2006.01)
*H01L 29/66* (2006.01)
(Continued)

(52) U.S. Cl.
CPC ...... *H01L 29/402* (2013.01); *H01L 21/28088* (2013.01); *H01L 21/765* (2013.01);
(Continued)

(58) Field of Classification Search
CPC ... H01L 29/402; H01L 29/404; H01L 29/407; H01L 29/66545; H01L 21/28088;
(Continued)

(56) References Cited

U.S. PATENT DOCUMENTS 9,590,053 B2   3/2017   Chou et al.
2011/0163376 A1   7/2011   Cheng et al.
(Continued)

OTHER PUBLICATIONS

Palankovski et al. "Field-Plate Optimization of AlGaN/GaN HEMTs." 2006 IEEE Compound Semiconductor Integrated Circuit Symposium, Nov. 12-15, 2006.
(Continued)

*Primary Examiner* — Didarul A Mazumder
(74) *Attorney, Agent, or Firm* — Eschweiler & Potashnik, LLC

(57) ABSTRACT

Various embodiments of the present disclosure are directed towards a method for forming an integrated chip. The method includes forming a source region and a drain region within a substrate. A drift region is formed within the substrate such that the drift region is disposed laterally between the source region and the drain region. A first gate structure is formed over the drift region. An inter-level dielectric (ILD) layer is formed over the first gate structure. The ILD layers is patterned to define a field plate opening. A first field plate layer, a second field plate layer, and a third field plate layer are formed within the field plate opening.

20 Claims, 13 Drawing Sheets

(51) Int. Cl.
*H01L 27/092* (2006.01)
*H01L 29/78* (2006.01)
*H01L 29/49* (2006.01)
*H01L 21/28* (2006.01)
*H01L 21/765* (2006.01)
*H01L 21/8238* (2006.01)

(52) U.S. Cl.
CPC .. *H01L 21/823842* (2013.01); *H01L 27/0922* (2013.01); *H01L 29/4966* (2013.01); *H01L 29/66545* (2013.01); *H01L 29/66681* (2013.01); *H01L 29/7816* (2013.01)

(58) Field of Classification Search
CPC ........... H01L 21/765; H01L 21/823842; H01L 27/0922; H01L 29/4966; H01L 29/66681; H01L 29/7816; H01L 29/4175; H01L 29/66689; H01L 29/66659; H01L 21/761; H01L 29/7835; H01L 23/49562; H01L 23/49575; H01L 29/0878; H01L 29/517; H01L 29/1045; H01L 29/41758
USPC ........................................................ 257/338
See application file for complete search history.

(56) References Cited

U.S. PATENT DOCUMENTS

| | | |
|---|---|---|
| 2012/0228695 A1 | 9/2012 | Toh et al. |
| 2013/0134512 A1 | 5/2013 | Cheng et al. |
| 2014/0264431 A1 | 9/2014 | Lal |
| 2016/0149007 A1* | 5/2016 | Chou .................... H01L 29/402 257/339 |
| 2019/0088777 A1 | 3/2019 | Lu et al. |
| 2019/0288112 A1* | 9/2019 | Wang ................. H01L 29/7816 |
| 2020/0227544 A1 | 7/2020 | Then et al. |

OTHER PUBLICATIONS

Professor N. Cheung, U.C. Berkeley. EE143 Microfabrication Technologies Fall 2010 Lecture Notes. "Lecture #22 Electrical Characteristics of MOS Devices." Published on Nov. 9, 2010.
Non-Final Office Action dated Jun. 10, 2020 for U.S. Appl. No. 16/417,735.
Notice of Allowance dated Sep. 18, 2020 for U.S. Appl. No. 16/417,735.

* cited by examiner

FIELD PLATE STRUCTURE FOR HIGH VOLTAGE DEVICE

REFERENCE TO RELATED APPLICATION

This application is a Divisional of U.S. application Ser. No. 16/417,735, filed on May 21, 2019, the contents of which are hereby incorporated by reference in their entirety.

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers in RF transmission/receiving chains due to their ability to handle high breakdown voltages (e.g., greater than about 50V) and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
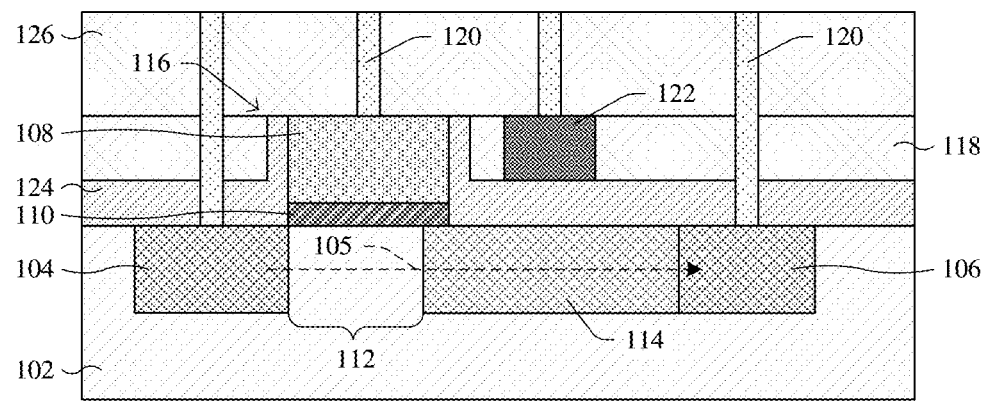
FIG. 1 illustrates a cross-sectional view of some embodiments of a high voltage transistor device having a field plate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High voltage transistor devices are often constructed to have field plates. Field plates are conductive elements, which are placed over a drift region of a high voltage transistor device to enhance the performance of the device by manipulating electric fields (e.g., reducing peak electric fields) generated by a gate electrode. By manipulating the electric field generated by the gate electrode, the high voltage transistor device can achieve higher breakdown voltages. For example, LDMOS (laterally diffused metal oxide semiconductor) transistor devices often comprise field plates that extend from a channel region to an adjacent drift region disposed between the channel region and a drain region.

Field plates can be formed in a number of different ways. For example, field plates may be formed by extending a conductive via directly over a drift region. However, in such configurations formation of the field plate utilizes additional processing steps that increase fabrication costs and/or damage the drift region. Alternatively, gate materials can be used for field plate formation such as polysilicon. However, as the features of transistors are shrunk (e.g., a length is less than 28 nanometers) a thickness of the polysilicon used for the field plate is reduced. Thus, due to the reduced polysilicon thickness, a process for forming contacts over the polysilicon may damage the drift region. In yet another alternative, insulating material can be formed in the drift region and function as a field plate. In such configurations, the non-metal materials are in a main path of current flow, thereby driving current under the insulating material, increasing resistance of the LDMOS transistor, and decreasing performance of the LDMOS transistor.

Accordingly, the present disclosure relates to a high voltage transistor device having a field plate made from gate materials, which is formed concurrently with adjacent gate electrodes to enable a low-cost method of fabrication while mitigating damage to the drift region. In some embodiments, the high voltage transistor device has a gate electrode overlying a substrate between a source region and a drain region located within the substrate. A contact etch stop layer (CESL) extends from a sidewall of the gate electrode to a drift region arranged between the gate electrode and the drain region. A field plate is located within a first inter-level dielectric (ILD) layer overlying the substrate. The field plate is disposed laterally between the sidewall of the gate electrode and the drift region and vertically extends from the CESL to an upper surface of the first ILD layer. An interconnect dielectric structure is formed over the high voltage transistor device. Conductive contacts extend through the interconnect dielectric structure and overlie the field plate, gate electrode, source region, and drain region. The field plate comprises metal materials with a work-function (e.g., N-metal or P-metal materials). This, in part, enhances a formation of a depletion region in the drift region without applying a bias to the field plate. Additionally, during formation of the conductive contacts, a high power plasma etch process is utilized. The field plate functions as an etch stop layer during the high power plasma etch process, thereby mitigating damage to the drift region.

FIG. 1 illustrates a cross-sectional view of some embodiments of a high voltage transistor device 100 having a field plate 122.

The high voltage transistor device 100 comprises a source region 104 and a drain region 106 disposed within a semiconductor substrate 102. The semiconductor substrate 102 has a first doping type (e.g., p-type), while the source and drain regions 104, 106 respectively have a second doping type (e.g., n-type), with a higher doping concentration than the semiconductor substrate 102. In some embodiments, the first doping type may be p-type and the second doping type may be n-type, or vice versa.

A gate structure 116 overlies the semiconductor substrate 102 at a position that is laterally arranged between the source region 104 and the drain region 106. The gate structure 116 comprises gate electrode 108 that is separated from the semiconductor substrate 102 by a gate dielectric layer 110. Upon receiving a bias voltage, the gate electrode 108 is configured to generate an electric field that controls the movement of charge carriers within a channel region 112 laterally disposed between the source region 104 and the drain region 106. For example, during operation, a gate-source voltage ($V_{GS}$) can be selectively applied to the gate electrode 108 relative to the source region 104, forming a conductive channel in the channel region 112. While $V_{GS}$ is applied to form the conductive channel, a drain to source voltage ($V_{DS}$) is applied to move charge carries (e.g., shown by arrow 105) between the source region 104 and the drain region 106. The channel region 112 laterally extends from the source region 104 to an adjacent drift region 114 (i.e., a drain extension region). The drift region 114 comprises the second doping type (e.g., n-type) having a relatively low doping concentration, which provides for a higher resistance at high operating voltages. The gate structure 116 is disposed over the channel region 112. In some embodiments, the gate structure 116 may extend from over the channel region 112 to a position overlying a portion of the drift region 114.

A first inter-level dielectric (ILD) layer 118 overlies the semiconductor substrate 102. One or more conductive structures are disposed within the first ILD layer 118. In some embodiments, the one or more conductive structures comprise a plurality of contacts 120 configured to provide for a vertical connection between the source region 104, the drain region 106, and/or the gate electrode 108 and a plurality of back-end-of-the-line (BEOL) metal wires overlying the contacts 120 and disposed within a second ILD layer (not shown).

The one or more conductive structures may further comprise a field plate 122 disposed within the first ILD layer 118 at a position laterally between the drain region 106 and the gate electrode 108. The field plate 122 comprises a metal material different than the gate electrode 108 and different than the contacts 120. The field plate 122 may be disposed over an etch stop layer 124 configured to separate the field plate 122 from the drift region 114 and the gate electrode 108. The etch stop layer 124 laterally extends past sidewalls of the source and drain regions 104, 106.

During operation, the field plate 122 is configured to act upon the electric field generated by the gate electrode 108. The field plate 122 may be configured to change distribution of the electric field generated by the gate electrode 108 in the drift region 114. This, in part, enhances the breakdown voltage capability of the high voltage transistor device 100. Further, in some embodiments, the field plate 122 acting upon the electric field generated by the gate electrode 108 reduces a high-field charge carrier trapping effect near the drain region 106. For example, during operation of the high voltage transistor device 100, the field plate 122 may reduce an electric field at an edge of the drain region 106 adjacent to the drift region 114 from approximately $2.9*10^6$ V/cm to approximately $1.4*10^6$ V/cm. In the aforementioned example, a gate electrode 108 to source region 104 voltage $V_{GS}$ is 0 volts, a drain region 106 to source region 104 voltage $V_{DS}$ is 7 volts, and the field plate 122 has a floating voltage and/or is not biased with a voltage. Thus, in some embodiments, the field plate 122 may reduce the electric field at the edge of the drain region 106 by at least fifty percent.

Figure 2A:
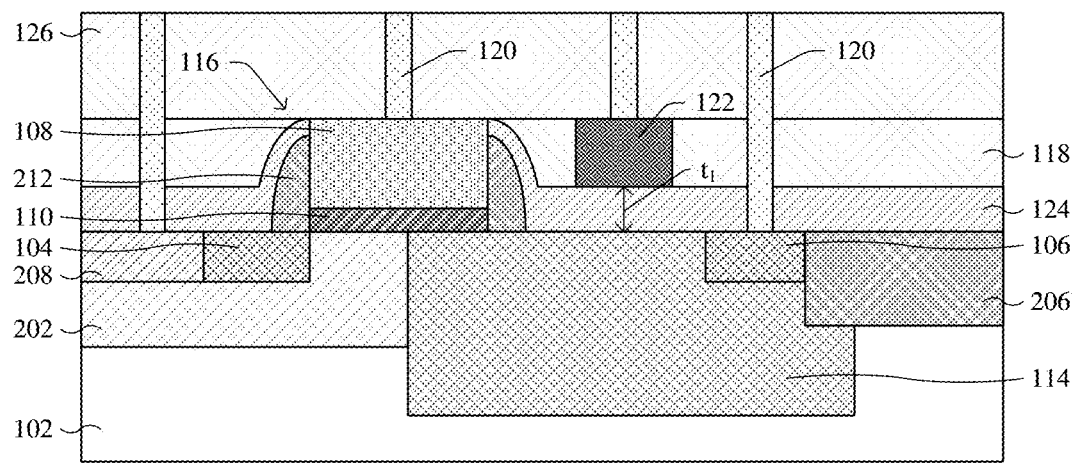
FIGS. 2A-2C illustrate cross-sectional views of various alternative embodiments of a high voltage laterally diffused metal-oxide semiconductor field-effect transistor (MOSFET) (LDMOS) device having a field plate.

FIG. 2A illustrates a cross-sectional view of some additional embodiments of a high voltage transistor device comprising a high voltage laterally diffused MOSFET (LDMOS) device 200 having a field plate 122.

The LDMOS device 200 comprises a source region 104 and a drain region 106 disposed within a semiconductor substrate 102. In some embodiments, the semiconductor substrate 102 may, for example, be a bulk substrate (e.g., a bulk silicon substrate), a silicon-on-insulator (SOI) substrate, or some other suitable substrate. The semiconductor substrate 102 has a first doping type (e.g., p-type), while the source region 104 and the drain region 106 comprise highly doped regions having a second doping type (e.g., n-type) different than the first doping type. In some embodiments, the first doping type may be p-type and the second doping type may be n-type, or vice versa. In some embodiments, the source region 104 and/or the drain region 106 may have doping concentrations that are approximately $10^{19}$ atoms/cm$^3$ or greater.

A contact region 208 having the first doping type (e.g., a p+ doping) laterally abuts the source region 104. The contact region 208 provides for an ohmic connection to the semiconductor substrate 102. In some embodiments, the contact region 208 may have a p-type doping concentration that is approximately $10^{19}$ atoms/cm$^3$ or greater. The contact region 208 and the source region 104 are disposed within a body region 202. The body region 202 has the first doping type with a doping concentration that is higher than that of the semiconductor substrate 102. For example, the semiconductor substrate 102 may have a doping concentration that is within a range of approximately $10^{14}$ to $10^{16}$ atoms/cm$^3$, while the body region 202 may have a doping concentration that is within a range of approximately $10^{16}$ to $10^{18}$ atoms/cm$^3$.

The drain region 106 is disposed within a drift region 114 that is arranged within the semiconductor substrate 102 at a position laterally abutting the body region 202. The drift region 114 comprises the second doping type (e.g., n-type) having a relatively low doping concentration, which provides for a higher resistance when the LDMOS device 200 is operated at a high voltage. In some embodiments, the drift region 114 may have a doping concentration that is within a range of approximately $10^{18}$ to $10^{20}$ atoms/cm$^3$. A shallow trench isolation (STI) structure 206 extends from a top surface of the semiconductor substrate 102 to a point below the top surface. The drain region 106 may abut the STI structure 206. The STI structure 206 is configured to electrically isolate the LDMOS device 200 from adjacent semiconductor devices disposed over and/or on the semiconductor substrate 102.

A gate structure 116 is disposed over the semiconductor substrate 102 at a position that is laterally arranged between the source region 104 and the drain region 106. In some embodiments, the gate structure 116 may laterally extend from over the body region 202 to a position overlying a portion of the drift region 114. The gate structure 116 comprises a gate electrode 108 that is separated from the semiconductor substrate 102 by a gate dielectric layer 110. In some embodiments, the gate dielectric layer 110 may comprise silicon dioxide, a high-κ dielectric material, or the like. As used herein, a high-κ dielectric material is a dielectric material with a dielectric constant greater than 3.9. In some embodiments, the gate electrode 108 comprises polysilicon and/or a metal gate material (e.g., tungsten, titanium, tantalum, and/or aluminum). In some embodiments, the gate structure 116 may also comprise sidewall spacers 212 disposed on opposing sides of the gate electrode 108. In various embodiments, the sidewall spacers 212 may, for example, be or comprise silicon oxide, silicon oxynitride, silicon carbide, silicon nitride, or the like.

An etch stop layer 124 extends along an upper surface of the semiconductor substrate 102, sides of the gate electrode 108, and sides of the sidewall spacer 212. In some embodiments, the etch stop layer 124 continuously extends from the gate electrode 108 over the drift region 114 beyond sidewalls of the drain region 106. In some embodiments, a top surface of the sidewall spacers 212 are vertically offset a top surface of the etch stop layer 124. In some embodiments, the top surface of the etch stop layer 124 and a top surface of the gate electrode 108 are substantially aligned. In some embodiments, the etch stop layer 124 may, for example, be or comprises silicon nitride, silicon carbide, or the like.

The field plate 122 vertically extends from the etch stop layer 124 to a top surface of the first ILD layer 118. The field plate 122 is laterally offset from the gate electrode 108 and the drain region 106. Sidewalls of the field plate 122 are surrounded by the first ILD layer 118. A thickness $t_1$ of the etch stop layer 124 is defined between a bottom surface of the field plate 122 and an upper surface of the semiconductor substrate 102. In some embodiments, the thickness $t_1$ is within a range of approximately 4 to 50 nanometers. In further embodiments, if the thickness $t_1$ is, for example, 4 nanometers or greater, then a breakdown voltage of the LDMOS device 200 is increased while providing sufficient protection for the semiconductor substrate 102 during a formation of the LDMOS device 200. In yet further embodiments, if the thickness $t_1$ is, for example, 50 nanometers or less, then a breakdown voltage of the LDMOS device 200 is further increased while mitigating fabrication costs of the LDMOS device 200. In some embodiments, a thickness of the field plate 122 is less than a thickness of the gate electrode 108. In some embodiments, the first ILD layer 118 may, for example, be or comprise an oxide, silicon oxide, a low-κ dielectric material, or the like. As used herein, a low-κ dielectric material is a dielectric material with a dielectric constant less than 3.9. In further embodiments, the first ILD layer 118 comprises a different dielectric material than the etch stop layer 124.

In some embodiments, the field plate 122 may, for example, be or comprise titanium nitride, tantalum nitride, titanium, tantalum, tungsten, aluminum, or the like. In various embodiments, the gate electrode 108 may, for example, be or comprise titanium nitride, tantalum nitride, titanium, tantalum, tungsten, aluminum, or the like. In further embodiments, the field plate 122 may comprise a different material than the gate electrode 108.

A second ILD layer 126 overlies the first ILD layer 118. A plurality of contacts 120 extend through the first and second ILD layers 118, 126. The contacts 120 overlie the contact region 208, the gate electrode 108, the field plate 122, and the drain region 106. In some embodiments, the contact 120 overlying the contact region 208 may comprise a butted contact (not shown), which contacts both the contact region 208 and the source region 104. In some embodiments, the plurality of contacts 120 and the field plate 122 may comprise materials different from one another. For example, the plurality of contacts 120 may comprise aluminum and/or copper and the field plate 122 may comprise titanium nitride, tantalum nitride, titanium, tantalum, and/or tungsten. In yet further embodiments, the plurality of contacts 120 and the field plate 122 may comprise a same material such as, for example, aluminum, tungsten, or the like.

Figure 2B:
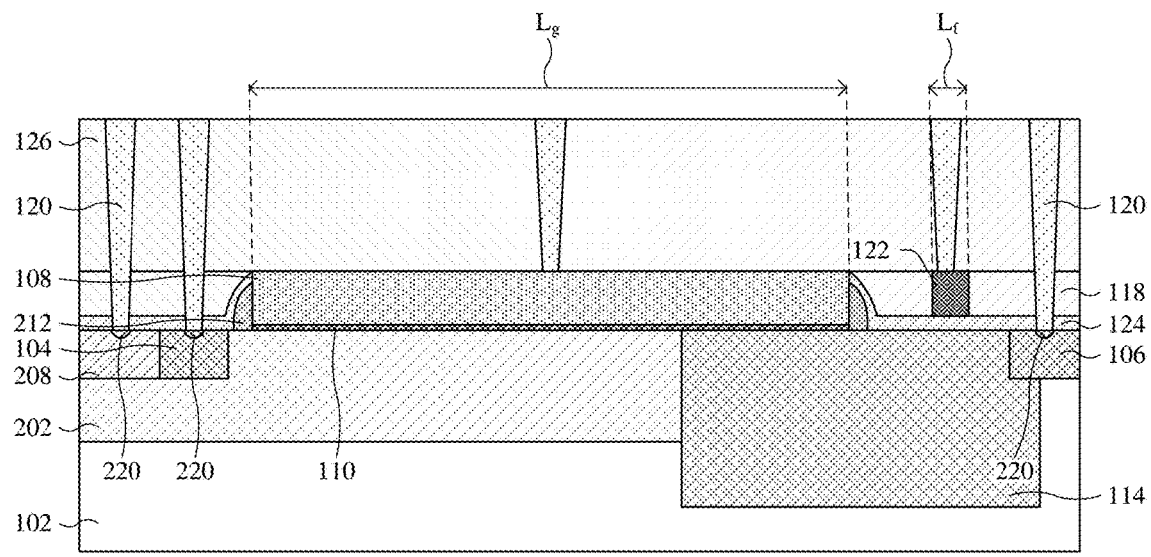

FIG. 2B illustrates a cross-sectional view of a LDMOS device 200b according to some alternative embodiments of the LDMOS device 200 of FIG. 2A.

Silicide layers 220 are disposed over and/or within the semiconductor substrate 102. The silicide layers 220 are configured to enhance electrical coupling between the contacts 120 and underlying semiconductor regions (e.g., the contact region 208, the source region 104, and/or the drain region 106). The gate electrode 108 has a gate length $L_g$ and the field plate 122 has a field plate length $L_f$. In some embodiments, the gate length $L_g$ is 16, 8, 4, or 2 times greater than the field plate length $L_f$. In further embodiments, the gate length $L_g$ is 28 nanometers or less. In yet further embodiments, the gate length $L_g$ being 16, 8, 4, or 2 times greater than the field plate length $L_f$ facilities increasing the breakdown voltage of the LDMOS device 200b while mitigating costs and time associated with forming the LDMOS device 200b.

Figure 2C:
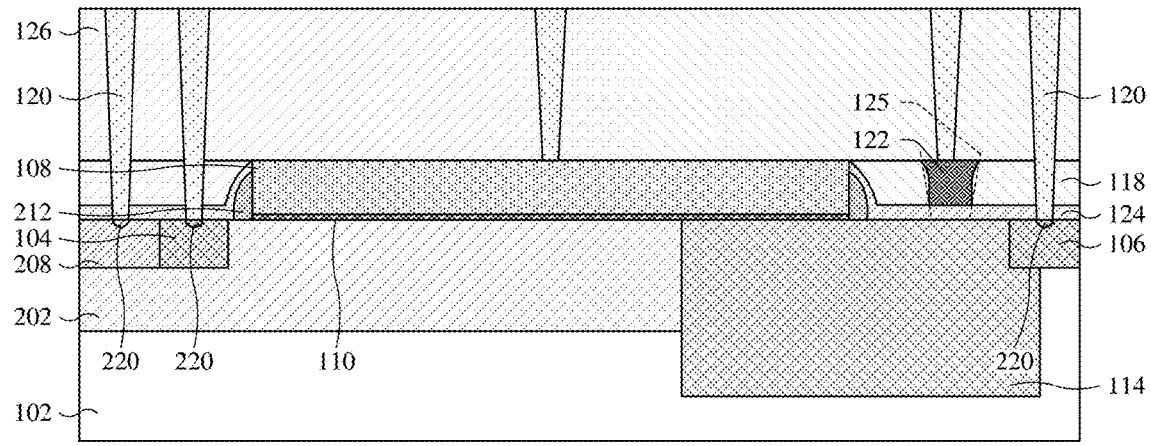

FIG. 2C illustrates a cross-sectional view of a LDMOS device 200c according to some alternative embodiments of the LDMOS device 200 of FIG. 2A.

In some embodiments, the field plate 122 has curved upper edges. This, in part, may reduce a parasitic capacitance between the field plate 122 and an adjacent contacts 120 (e.g., the contact 120 overlying the drain region 106), and/or reduce a parasitic capacitance between the field plate 122 and adjacent gate electrodes (e.g., the gate electrode 108). Reducing the parasitic capacitance may increase a performance of the LDMOS device 200c by reducing power consumption. In further embodiments, the field plate 122 may have slanted sidewalls, such as indicated by dashed lines 125 in FIG. 2C.

Figure 3A:
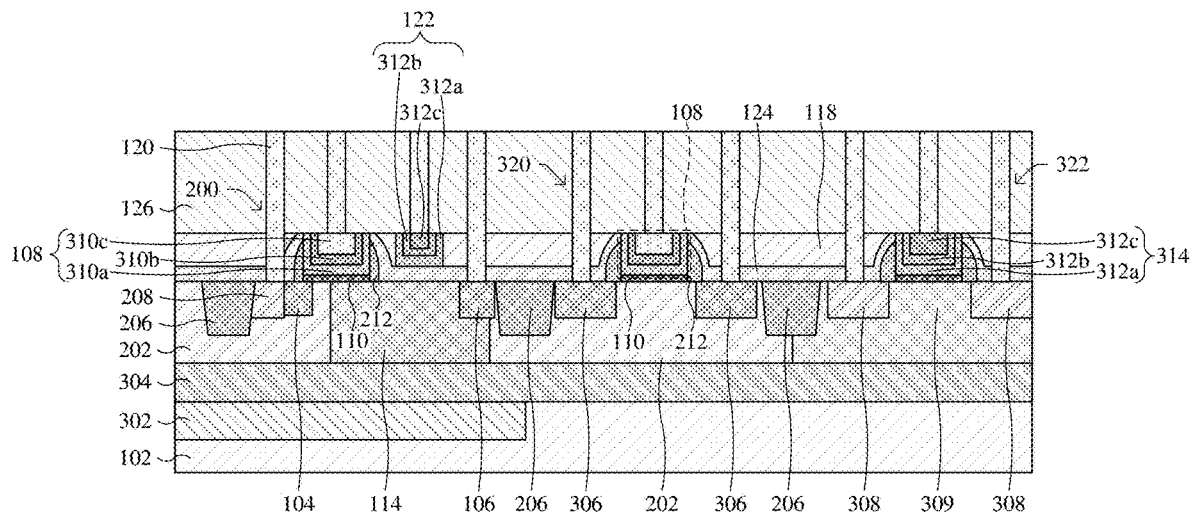
FIGS. 3A-3F illustrate cross-sectional views of various alternative embodiments of the high voltage LDMOS device of FIG. 2A.

FIG. 3A illustrates a cross-sectional view of some embodiments of a high voltage device 300a comprising the LDMOS device 200 of FIG. 2 and adjacent semiconductor devices 320, 322.

The high voltage device 300a comprises a LDMOS device 200 such that the gate electrode 108 comprises a first plurality of gate electrode layers 310a-c and the field plate 122 comprises a second plurality of gate electrode layers 312a-c. In some embodiments the first plurality of gate electrode layers 310a-c are configured as a work function structure. In further embodiments, the gate electrode layers 310a-c respectively comprise metal materials different from one another. In yet further embodiments, the gate electrode layers 310a-c may, for example, be or comprise titanium nitride, tantalum nitride, titanium, tantalum, tungsten, aluminum, or the like.

In some embodiments, a first gate electrode layer 310a is configured as an insulator layer with a dielectric constant greater than 4. In the aforementioned embodiment, the first gate electrode layer 310a may, for example, be or comprise silicon nitride, hafnium oxide, zirconium oxide, or the like. A second gate electrode layer 310b may, for example, be or comprise aluminum, titanium, tantalum, tungsten, titanium nitride, tantalum nitride, or the like. A third gate electrode layer 310c may, for example, be or comprise aluminum, titanium, tantalum, tungsten, titanium nitride, tantalum nitride, or the like and is different from the second gate electrode layer 310b. In some embodiments, a contact interface layer may be disposed between the third gate electrode layer 310c and an overlying contact 120 (not shown). The contact interface layer may, for example, be or comprise a silicide, nickel silicide, titanium silicide, copper, nickel, titanium, or the like.

A first high voltage transistor 320 is disposed laterally adjacent to the LDMOS device 200. The first high voltage transistor 320 is electrically isolated from the LDMOS device 200 by an STI structure 206. The first high voltage transistor 320 comprises a gate electrode 108 overlying a gate dielectric layer 110. Sidewall spacers 212 surround outer sidewalls of the gate electrode 108. The gate electrode 108 of the first high voltage transistor 320 may, for example, be configured as the gate electrode 108 of the LDMOS device 200. Source/drain regions 306 are disposed on opposite sides of the gate electrode 108 of the first high voltage transistor 320. In some embodiments, the source/drain regions 306 respectively comprise the second doping type (e.g., n-type) and/or have a doping concentration within a range of approximately $10^{18}$ to $10^{20}$ atoms/cm$^3$.

In some embodiments in which the source region 104, the drain region 106, and the source/drain regions 306 are n-type, the gate electrode 108 comprises n-type polysilicon, a metal with an n-type work function, or some other suitable conductive material with an n-type work function. For example, the gate electrode layers 310a-c respectively comprise a metal with an n-type work function. As used herein, an n-type work function may, for example, be: 1) a work function within about 0.1 eV, 0.2 eV, or 0.4 eV of a work function for n-type polycrystalline silicon; 2) a work function less than about 4.0 eV, 4.2 eV, or 4.4 eV; 3) a work function between about 3.5-4.4 eV, 4.0-4.4 eV, or 3.8-4.5 eV; 4) other suitable n-type work functions; or 5) any combination of the foregoing. As used herein, a metal with an n-type work function may be or comprise, for example, hafnium, zirconium, titanium, tantalum, aluminum, some other suitable n-type work function metal(s), or any combination of the foregoing.

The field plate 122 comprises the second plurality of gate electrode layers 312a-c. In some embodiments, the second plurality of gate electrode layers 312a-c are configured as a work function structure. The gate electrode layers 312a-b are respectively U-shaped. In some embodiments, the gate electrode layers 312a-c respectively comprise metal materials different from one another. In yet further embodiments, the gate electrode layers 312a-c may, for example, respectively be or comprise titanium nitride, tantalum nitride, titanium, tantalum, tungsten, aluminum, or the like.

A second high voltage transistor 322 is disposed laterally adjacent to the first high voltage transistor 320. The second high voltage transistor 322 is electrically isolated from the first high voltage transistor 320 by an STI structure 206. The second high voltage transistor 322 comprises a gate electrode 314 overlying a gate dielectric layer 110. Sidewall spacers 212 surround outer sidewalls of the gate electrode 314 and the gate dielectric layer 110. Source/drain regions 308 are disposed in a well region 309. The source/drain regions 308 comprise the first doping type (e.g., p-type), the well region 309 comprises the second doping type (e.g., n-type), such that the first doping type is opposite the second doping type. In some embodiments, the source/drain regions 308 respectively have a doping concentration within a range of approximately $10^{18}$ to $10^{20}$ atoms/cm$^3$ and the well region 309 has a doping concentration within a range of approximately $10^{16}$ to $10^{18}$ atoms/cm$^3$.

In some embodiments, the gate electrode 314 comprises the second plurality of gate electrode layers 312a-c. In some embodiments, in which the source/drain regions 308 are p-type, the second plurality of gate electrode layers 312a-c are respectively metal with a p-type work function and/or some other suitable conductive material with a p-type work function. As used herein, a p-type work function may, for example, be: 1) a work function within about 0.1 eV, 0.2 eV, or 0.4 eV of a work function for p-type polycrystalline silicon; 2) a work function greater than about 4.8 eV, 5.0 eV, or 5.2 eV; 3) a work function between about 4.8-5.2 eV, 5.0-5.4 eV, or 4.6-5.6 eV; 4) other suitable p-type work functions; or 5) any combination of the foregoing. As used herein, a metal with a p-type work function may be, for example, ruthenium, palladium, platinum, cobalt, nickel, titanium aluminum nitride, tungsten carbon nitride, some other suitable p-type work function metal(s), or any combination of the foregoing.

In some embodiments, a first gate electrode layer 312a is configured as an insulator layer with a dielectric constant greater than 4. In the aforementioned embodiment, the first gate electrode layer 312a may, for example, be or comprise silicon nitride, hafnium oxide, zirconium oxide, or the like. A second gate electrode layer 312b may, for example, be or comprise aluminum, titanium, tantalum, tungsten, titanium nitride, tantalum nitride, or the like. A third gate electrode layer 312c may, for example, be or comprise aluminum, titanium, tantalum, tungsten, titanium nitride, tantalum nitride, or the like. In some embodiments, a contact interface layer may be disposed between the third gate electrode layer 312c of the second high voltage transistor 322 and an overlying contact 120 (not shown). The contact interface layer may, for example, be or comprise a silicide, nickel silicide, titanium silicide, copper, nickel, titanium, or the like.

Accordingly, in some embodiments, the field plate 122 is comprised of metal(s) with p-type work function(s) and the adjacent gate electrode 108 of the LDMOS device 200 is comprised of a metal(s) with an n-type work function(s). In some embodiments, the field plate 122 may comprise a same stack of metal layers as the adjacent gate electrode 108. In further embodiments, the field plate 122 and the gate electrode 314 respectively comprise a first stack of layers that are the same as one another and/or the gate electrode 108 comprises a second stack of layers that are different from the first stack of layers.

A deep well 304 comprising the first doping type (e.g., p-type) is disposed in the semiconductor substrate 102 directly below the drift region 114 and the body region 202. In some embodiments, the deep well 304 may, for example, have a doping concentration that is within a range of approximately $10^{16}$ to $10^{18}$ atoms/cm$^3$. The deep well 304 is configured to enhance formation of a depletion region in the drift region 114, thereby decreasing a magnitude of the electric field on a surface of the semiconductor substrate 102. This, in part, facilitates application of higher voltages to the LDMOS device 200. An extra deep well region 302 comprising the second doping type (e.g., n-type) is disposed in the semiconductor substrate 102 directly below the deep well 304. The extra deep well region 302 is configured to enhance electrical isolation between the LDMOS device 200 and other semiconductor devices disposed on the semiconductor substrate 102. In some embodiments, the extra deep well region 302 may, for example, have a doping concentration that is within a range of approximately $10^{16}$ to $10^{18}$ atoms/cm$^3$. Thus, in some embodiments, the extra deep well region 302 and the deep well 304 have approximately a same doping concentration.

Figure 3B:
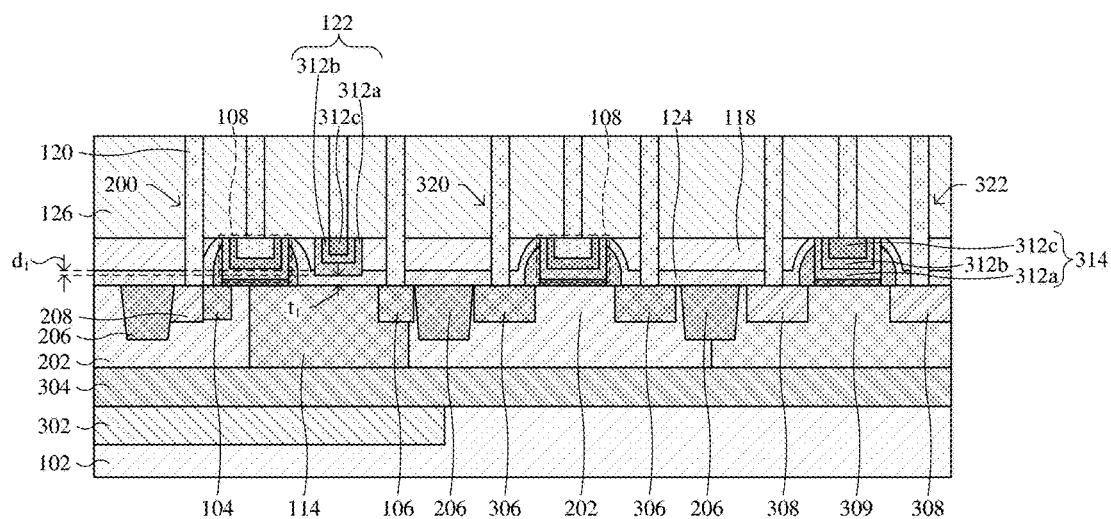

FIG. 3B illustrates a cross-sectional view of a high voltage device 300b according to some alternative embodiments of the high voltage device 300a of FIG. 3A.

A bottom surface of the field plate 122 is disposed below an upper surface of the etch stop layer 124 by a distance $d_1$, thereby defining a thickness $t_1$ of the etch stop layer 124 between the drift region 114 and the bottom surface of the field plate 122. In some embodiments, the thickness $t_1$ is within a range of approximately 4 to 50 nanometers. In some embodiments, if the thickness $t_1$ is 4 nanometers or more, then a breakdown voltage of the LDMOS device 200 may be approximately 15 volts or greater while mitigating damage to the semiconductor substrate 102. In further embodiments, if the thickness $t_1$ is 50 nanometers or less, then a breakdown voltage of the LDMOS device 200 may be approximately 20 volts or less while reducing costs and time associated with forming the field plate 122.

Figure 3C:
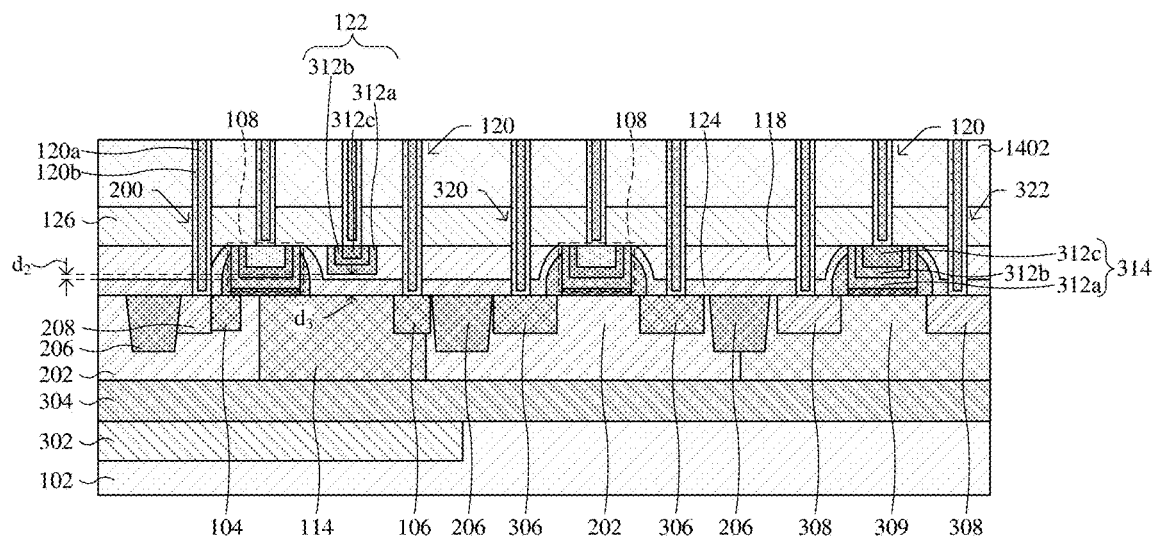

FIG. 3C illustrates a cross-sectional view of a high voltage device 300c according to some alternative embodiments of the high voltage device 300a of FIG. 3A.

The contacts 120 respectively comprise an inner conductive body 120a surrounded by an outer conductive body 120b. In some embodiments, the inner conductive body 120a may, for example, be or comprise tungsten, aluminum, copper, or the like and/or the outer conductive body 120b may, for example, be or comprise titanium, nitride, titanium nitride, or the like. The bottom surface of the field plate 122 is separated from an upper surface of the etch stop layer 124 by a distance $d_2$. Thus, the bottom surface of the field plate 122 is vertically offset a top surface of the semiconductor substrate 102 by a distance $d_3$. In some embodiments, the distance $d_3$ is within a range of approximately 4 to 50 nanometers. A break down voltage of the LDMOS device 200 may be configured by adjusting the distance $d_3$.

Figure 3D:
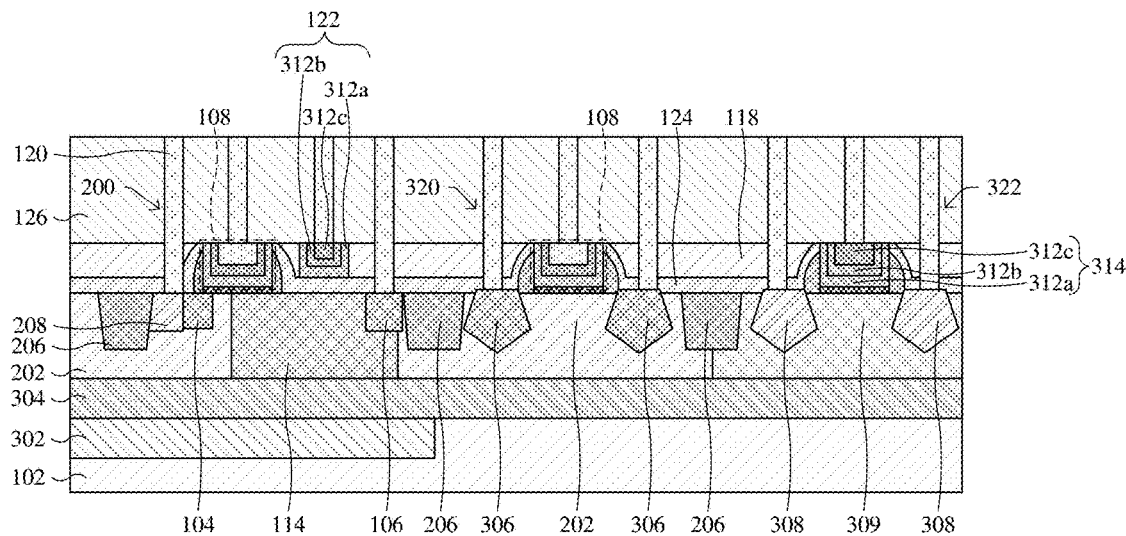

FIG. 3D illustrates a cross-sectional view of a high voltage device 300d according to some alternative embodiments of the high voltage device 300a of FIG. 3A.

In some embodiments, the source/drain regions 306, 308 of the first and second high voltage transistors 320, 322 may respectively be another material than the semiconductor substrate 102. For example, the source/drain regions 306, 308 respectively may be fabricated by an epitaxial process and/or may, for example, be or comprise silicon carbide, silicon germanium, or the like. In some embodiments, the source/drain regions 306 may be n-type and the source/drain regions 308 may be p-type, or vice versa. Further, as illustrated in FIG. 3D, the source/drain regions 306, 308 may respectively have a polygon shape, such as a pentagon, a rectangle, a hexagon, or the like. In such embodiments, a top surface of the source/drain regions 306, 308 may be vertically offset a top surface of the semiconductor substrate 102 by a non-zero distance.

Figure 3E:
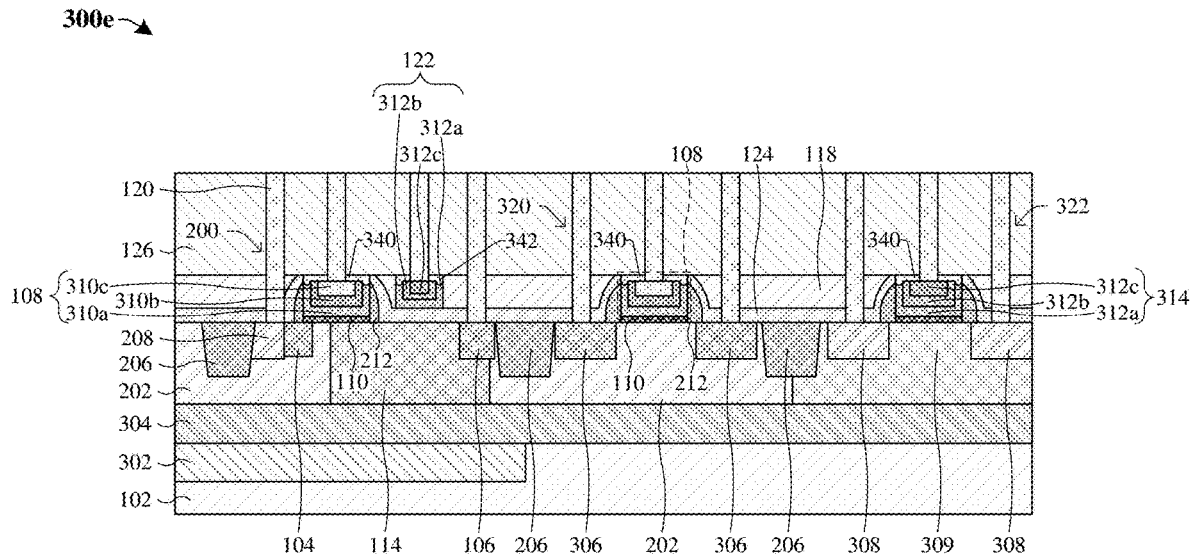

FIG. 3E illustrates a cross-sectional view of a high voltage device 300e according to some alternative embodiments of the high voltage device 300a of FIG. 3A.

As illustrated in FIG. 3E, a capping layer 340 overlies the gate electrode 108 of the LDMOS device 200, the gate electrode 108 of the first high voltage transistor 320, and the gate electrode 314 of the second high voltage transistor 322. In some embodiments, the capping layer 340 may, for example, be or comprise silicon-oxy-nitride, silicon nitride, or the like. In further embodiments, a capping layer 342 (e.g., comprising silicon-oxy-nitride, silicon nitride, etc.) overlies the field plate 122. In some embodiments, the capping layer 342 is omitted (not shown) and the second ILD layer 126 extends over an upper surface of the field plate 122. In some embodiments, a bottom surface of the contacts 120 overlying the gate electrode 108, 314 are respectively aligned with a substantially straight horizontal line (not shown), wherein a top surface of the field plate 122 is aligned with the substantially straight horizontal line.

Figure 3F:
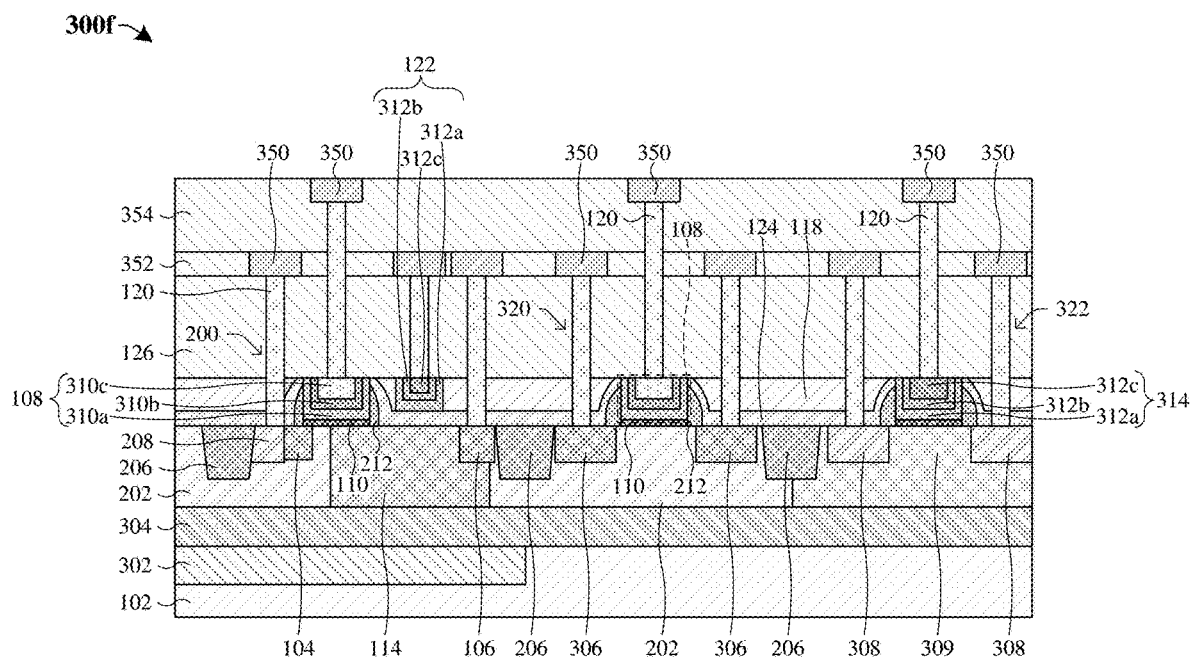

FIG. 3F illustrates a cross-sectional view of a high voltage device 300f according to some alternative embodiments of the high voltage device 300a of FIG. 3A.

In some embodiments, a plurality of conductive wires 350 (e.g., comprising aluminum, copper, etc.) overlie the contacts 120. A third ILD layer 352 overlies the second ILD layer 126, and a fourth ILD layer 354 overlies the third ILD layer 352. In such embodiments, the conductive wires 350 overlying the contacts 120 that respectively overlie the source/drain regions 306, 308, the source region 104, the drain region 106, and the field plate 122 are disposed within the third ILD layer 352. Further, the conductive wires 350 overlying the contacts 120 that respectively overlie the gate electrodes 108, 314 are disposed within the fourth ILD layer 354 and are vertically offset the third ILD layer 352 by a non-zero distance. Thus, a top surface of each contact 120 disposed within a first level (e.g., contacts 120 that respectively overlie source/drain regions 306, 308, source region 104, drain region 106, and/or the field plate 122) are respectively disposed along a first substantially straight horizontal line, wherein a top surface of each contact 120 disposed within a second level (e.g., contacts 120 that respectively overlie gate electrodes 108, 314) are respectively disposed along a second substantially straight horizontal line that is vertically offset the first substantially straight horizontal line.

FIGS. 4-16 illustrate cross-sectional views 400-1600 of some embodiments of a method of forming a high voltage LDMOS device having a field plate according to the present disclosure. Although the cross-sectional views 400-1600 shown in FIGS. 4-16 are described with reference to a method, it will be appreciated that the structures shown in FIGS. 4-16 are not limited to the method but rather may stand alone separate of the method. Although FIGS. 4-16 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 4:
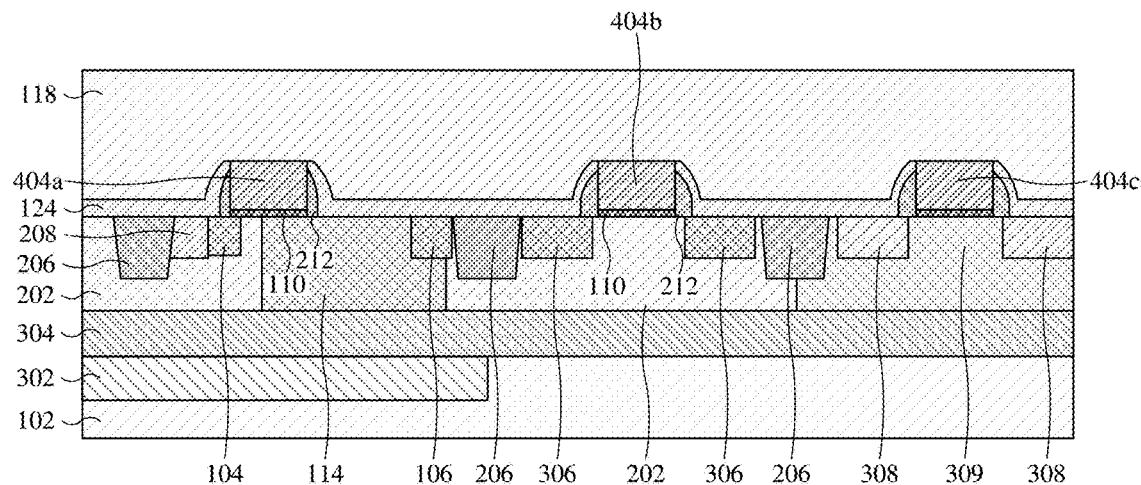
FIGS. 4-16 illustrate cross-sectional views of some embodiments of a method of forming a high voltage LDMOS device having a field plate.

As shown in cross-sectional view 400 of FIG. 4, a plurality of dummy gate electrode structures 404a-c overlying a semiconductor substrate 102 is provided. In some embodiments, a method for forming the structure of FIG. 4 may comprise forming the gate dielectric layers 110 over the semiconductor substrate 102. The dummy gate electrode structures 404a-c, which typically comprise polysilicon, are respectively formed over the gate dielectric layers 110. After forming the dummy gate electrode structures 404a-c, the source/drain regions 306, 308, the source region 104, and/or the drain region 106 may be formed in the semiconductor substrate 102 by a doping process. In some embodiments, other doped regions (e.g., contact region 208, body region 202, drift region 114, well region 309, deep well 304, and/or extra deep well region 302) may be formed by one or more other doping process before forming the gate dielectric layers 110. In some embodiments, a channel region is defined in the body region 202 between the source region 104 and the drift region 114. In yet further embodiments, a portion of the other doped regions may be formed with the source/drain regions 306, 308, and/or a remaining portion of the other doped regions may be formed after forming the gate dielectric layers 110. In yet further embodiments, the shallow trench isolation (STI) structures 206 may be formed in the semiconductor substrate 102 before the other doping process.

The sidewall spacers 212 may be formed around outer sidewalls of the dummy gate electrode structures 404a-c. The etch stop layer 124 is formed over the semiconductor substrate 102, around the sidewall spacers 212, and around the dummy gate electrode structures 404a-c. The first interlevel dielectric (ILD) layer 118 is formed over the etch stop layer 124 and the dummy gate electrode structures 404a-c. In some embodiments, the above layers and/or structures may be formed using a deposition process such as, for example, chemical vapor deposition (CVD), physical vapor deposition (PVD), some other suitable deposition process (es), or any combination of the foregoing.

Figure 5:
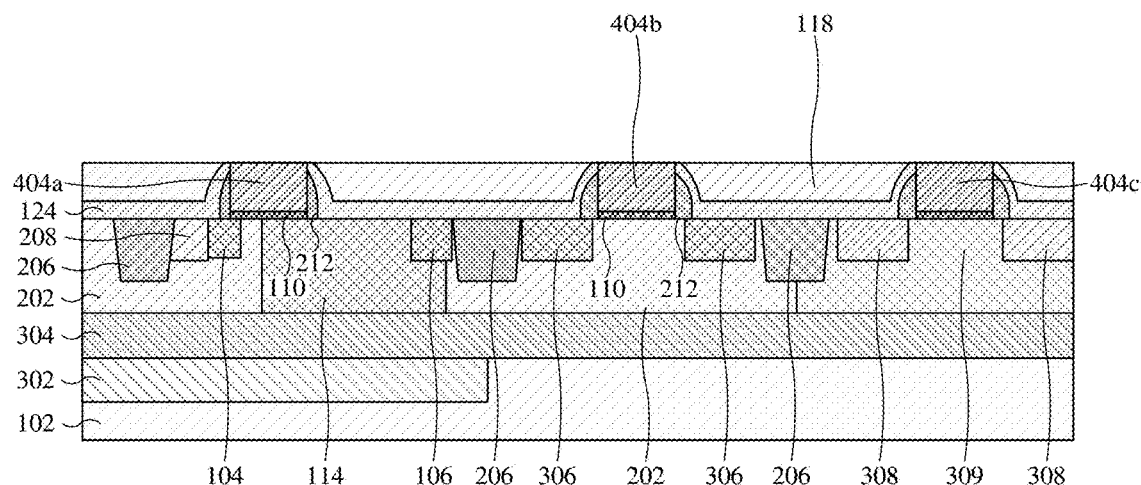

As shown in cross-sectional view 500 of FIG. 5, a planarization process (e.g., a chemical mechanical planarization (CMP) process) is performed on the structure of FIG. 4 until an upper surface of each dummy gate electrode structure 404a-c is exposed.

Figure 6:
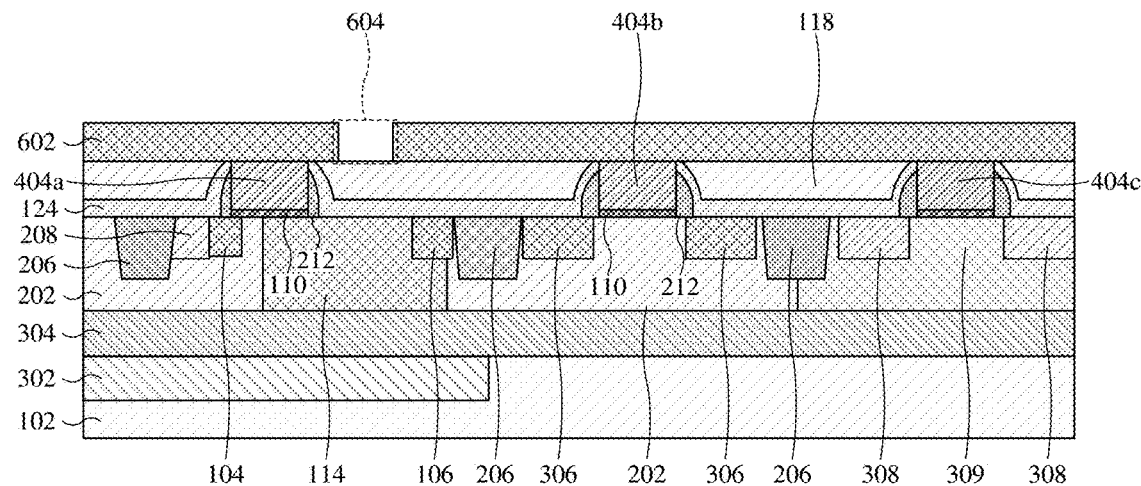

As shown in cross-sectional view 600 of FIG. 6, a masking layer 602 is formed over the first ILD layer 118, and the dummy gate electrode structures 404a-c. The masking layer 602 comprises sidewalls defining an opening 604 over the drift region 114. In some embodiments, the masking layer 602 is a hard mask layer. In further embodiments, the masking layer 602 is configured to protect the dummy gate electrode structures 404a-c during subsequent processing steps.

Figure 7:
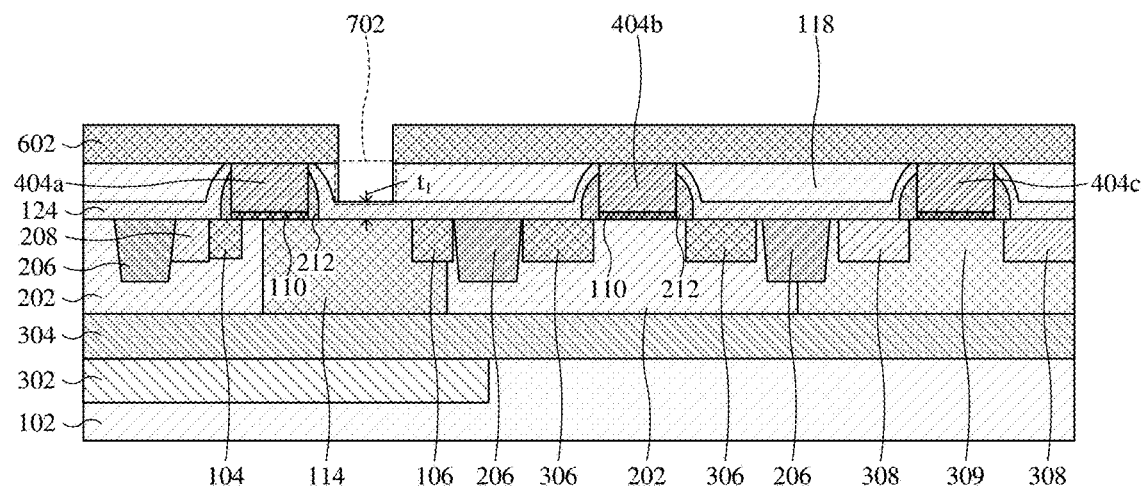

As shown in cross-sectional view 700 of FIG. 7, the first ILD layer 118 is patterned according to the masking layer 602, such that the first ILD layer 118 comprises opposing sidewalls defining a field plate opening 702. In some embodiments, the patterning process includes exposing the first ILD layer 118 to one or more etchants. In some embodiments, after performing the patterning process, the masking layer 602 is removed (not shown), for example, by a planarization process (e.g., a CMP process).

In further embodiments, the patterning process removes a portion of the etch stop layer 124 underlying the field plate opening 702 (not shown). In the aforementioned embodiment, the patterning process is performed in such a manner to control the thickness $t_1$ of the etch stop layer 124, and can ultimately correspond to the structure of FIG. 3B after manufacturing is completed.

Figure 8:
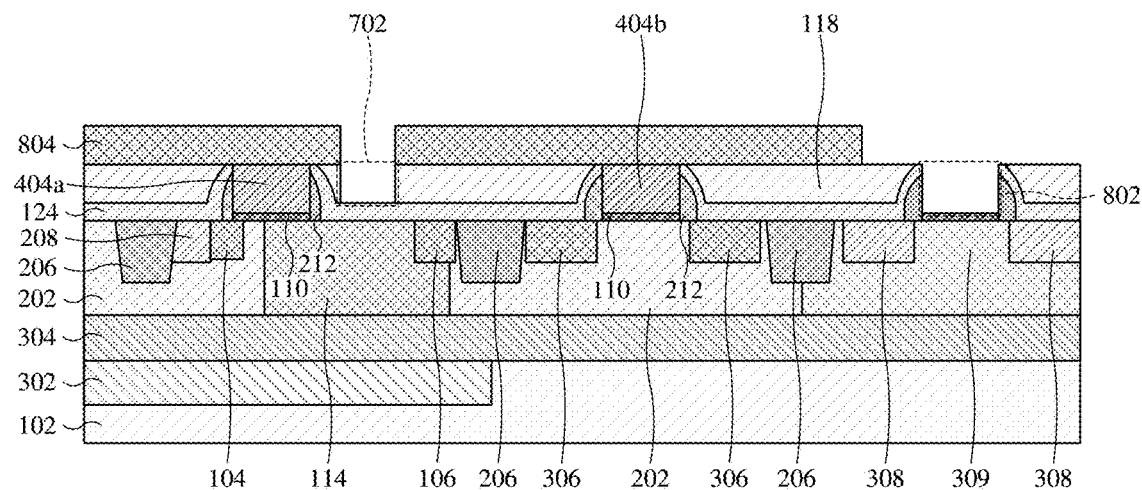

As shown in cross-sectional view 800 of FIG. 8, a masking layer 804 is formed over the first ILD layer 118. A first dummy gate electrode structure (404c of FIG. 7) is removed, thereby defining a gate electrode opening 802 above the gate dielectric layer 110. The first dummy gate electrode structure (404c of FIG. 7) may be removed by performing an etch process according to the masking layer 804, thereby defining the gate electrode opening 802. In further embodiments, removing the first dummy gate electrode structure (404c of FIG. 7) may comprise performing a dry etch process and/or performing a wet etch process. In further embodiments, the masking layer 804 may cover an entire upper surface of the first ILD layer 118 and/or fill the field plate opening 702 (not shown). This, in part, may protect the first ILD layer 118 from damage during the removal of the first dummy gate electrode structure (404c of FIG. 7).

Figure 9:
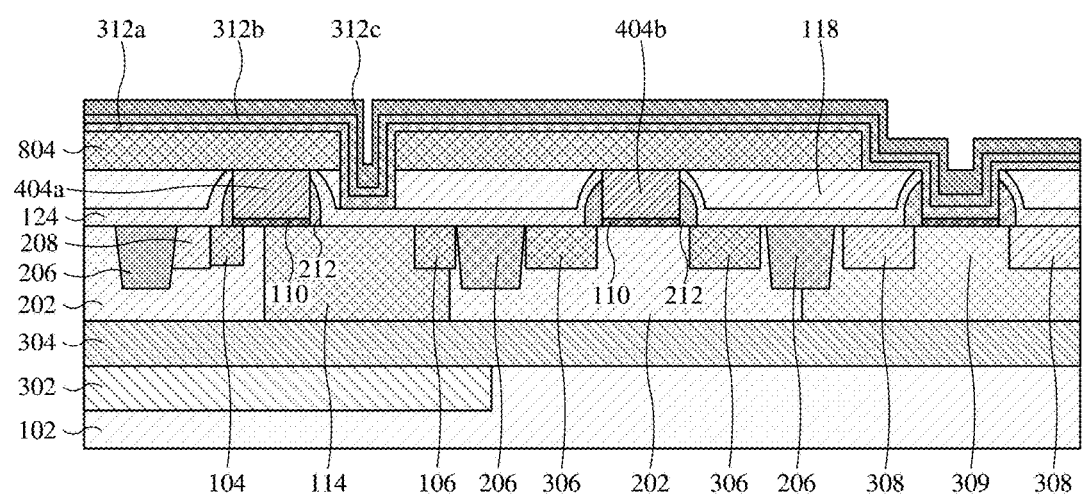

As shown in cross-sectional view 900 of FIG. 9, a second plurality of gate electrode layers 312a-c is formed over the structure of FIG. 8. The second plurality of gate electrode layers 312a-c fills the field plate opening (702 of FIG. 7) and the gate electrode opening (802 of FIG. 8). In some embodiments, the second plurality of gate electrode layers 312a-c are respectively metal with a p-type work function and/or some other suitable conductive material with a p-type work function. In some embodiments, a first gate electrode layer 312a may, for example, be or comprise hafnium oxide, zirconium oxide, silicon oxynitride, silicon nitride, titanium nitride, tantalum nitride, titanium aluminum nitride, tantalum aluminum nitride, titanium, tantalum, aluminum, or the like. In some embodiments, a second gate electrode layer 312b may, for example, be or comprise titanium nitride, tantalum nitride, titanium aluminum nitride, tantalum aluminum nitride, titanium, tantalum, aluminum, or the like. In some embodiments, a third gate electrode layer 312c may, for example, be or comprise titanium nitride, tantalum nitride, titanium aluminum nitride, tantalum aluminum nitride, titanium, tantalum, aluminum, tungsten, copper, or the like. In yet further embodiments, the second plurality of gate electrode layers 312a-c may, for example, be or comprise three or more layers, such as four layers, five layers, six layers, etc.

Figure 10:
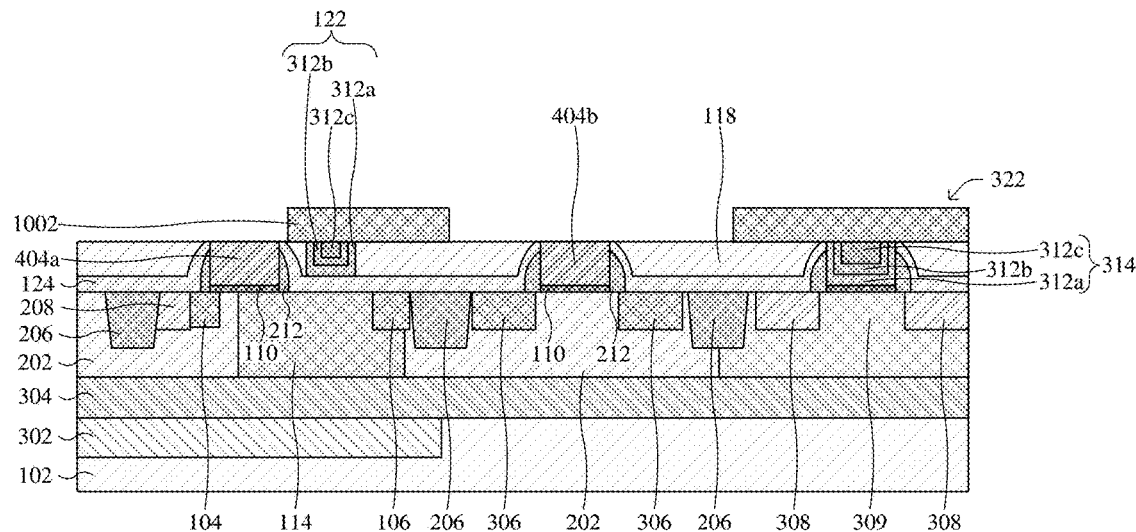

As shown in cross-sectional view 1000 of FIG. 10, a planarization process (e.g., a CMP process) is performed on the structure of FIG. 9, such that upper surfaces of the dummy gate electrode structures 404a-b are exposed. This, in part, defines a field plate 122 and a second high voltage transistor 322. The planarization process may remove the masking layer (804 of FIG. 9), portions of the second plurality of gate electrode layers 312a-c. After performing the planarization process, a masking layer 1002 is formed over the field plate 122 and the second high voltage transistor 322. The masking layer 1002 is configured to protect the field plate 122 and the second high voltage transistor 322 from subsequent processing steps. Further, the masking layer 1002 comprises sidewalls, such that upper surfaces of the dummy gate electrode structures 404a-b are exposed. In further embodiments, the masking layer 1002 may cover an entire upper surface of the first ILD layer 118 (not shown). This, in part, may protect the first ILD layer 118 from damage during subsequent processing steps.

Figure 11:
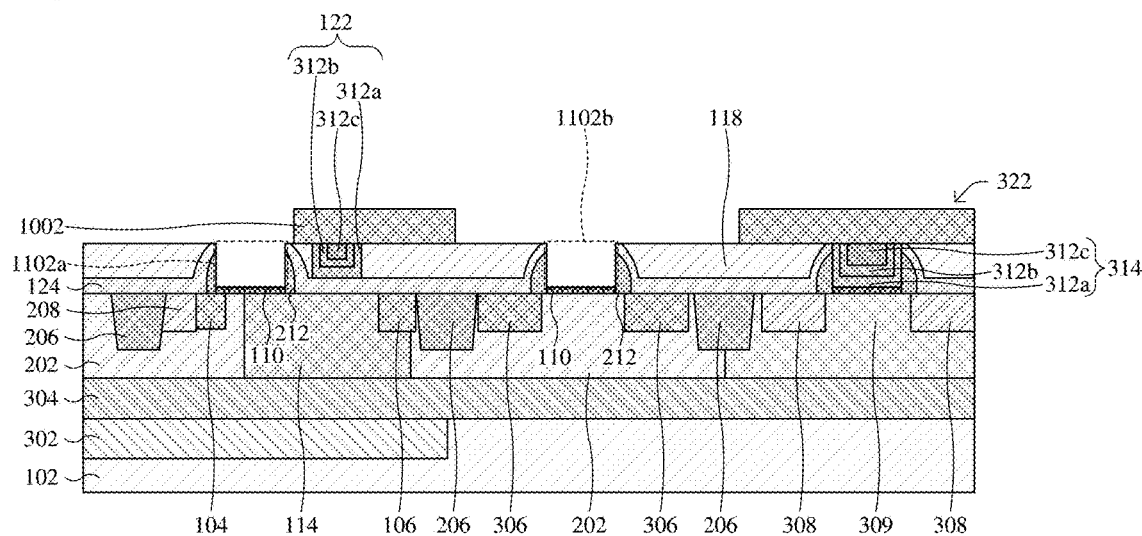

As shown in cross-sectional view 1100 of FIG. 11, a removal process is performed on the structure of FIG. 10 according to the masking layer 1002, thereby defining gate electrode openings 1102a-b above gate dielectric layers 110. In some embodiments, the removal process comprises exposing the structure of FIG. 10 to one or more etchants, performing a wet etch process, and/or performing a dry etch process. In some embodiments, a planarization process (e.g., a CMP process) is performed to remove the masking layer 1002 (not shown).

Figure 12:
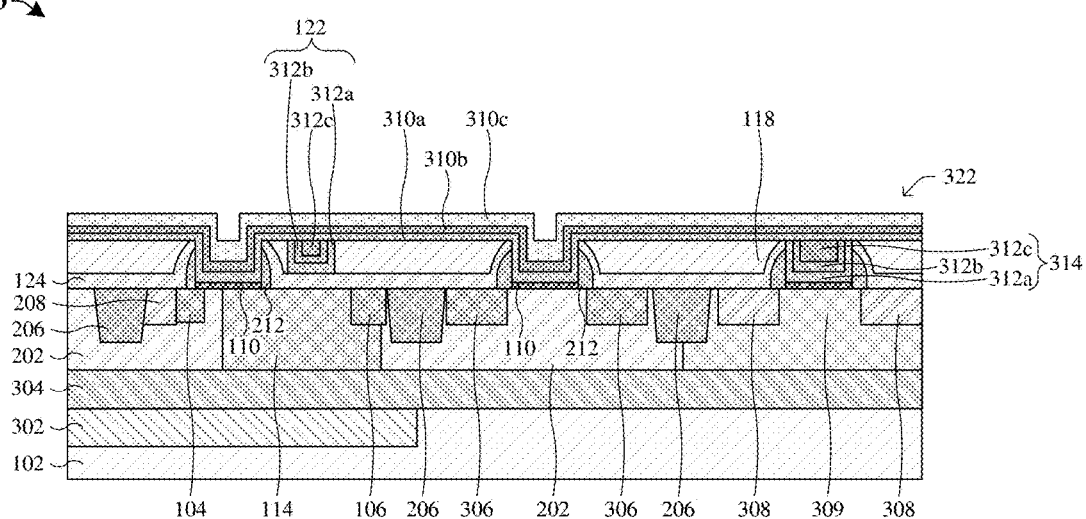

As shown in cross-sectional view 1200 of FIG. 12, a first plurality of gate electrode layers 310a-c is formed over the structure of FIG. 11. The first plurality of gate electrode layers 310a-c fill the gate electrode openings (1102a-b of FIG. 11). In some embodiments, the first plurality of gate electrode layers 310a-c are respectively metal with an n-type work function and/or some other suitable conductive material with an n-type work function.

In some embodiments, a first gate electrode layer 310a may, for example, be or comprise hafnium oxide, zirconium oxide, silicon oxynitride, silicon nitride, titanium nitride, tantalum nitride, titanium aluminum nitride, tantalum aluminum nitride, titanium, tantalum, aluminum, or the like. In some embodiments, a second gate electrode layer 310b may, for example, be or comprise titanium nitride, tantalum nitride, titanium aluminum nitride, tantalum aluminum nitride, titanium, tantalum, aluminum, or the like. In some embodiments, a third gate electrode layer 310c may, for example, be or comprise titanium nitride, tantalum nitride, titanium aluminum nitride, tantalum aluminum nitride, titanium, tantalum, aluminum, tungsten, copper, or the like. In yet further embodiments, the first plurality of gate electrode layers 310a-c may, for example, be or comprise three or more layers, such as four layers, five layers, six layers, etc. In some embodiments, a combination of materials in the first plurality of gate electrode layers 310a-c are different than a combination of materials in the second plurality of gate electrode layers 312a-c.

Figure 13:
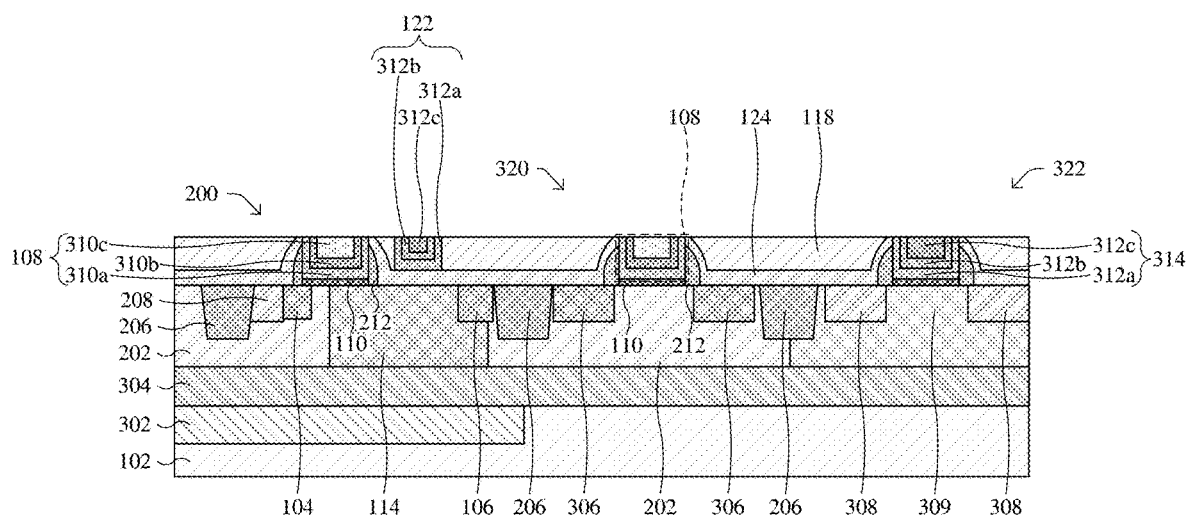

As shown in cross-sectional view 1300 of FIG. 13, a planarization process (e.g., a CMP process) is performed on the structure of FIG. 12, such that upper surfaces of the field plate 122 and the second high voltage transistor 322 are exposed. This, in part, defines the LDMOS device 200 and the first high voltage transistor 320. The planarization process removes portions of the first plurality of gate electrode layers 310a-c.

Figure 14:
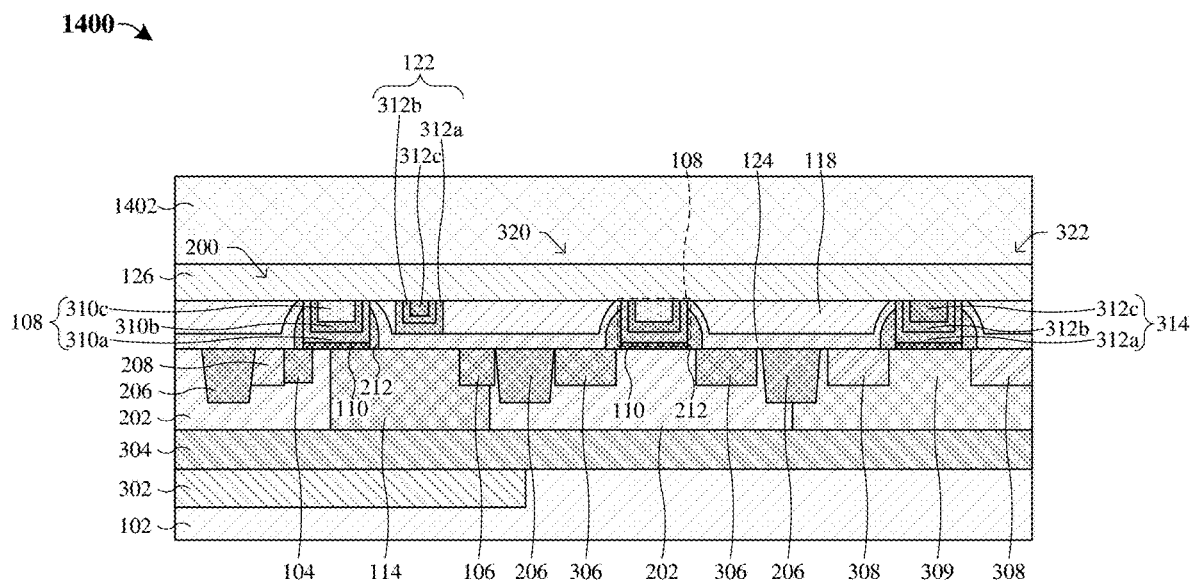

As shown in cross-sectional view 1400 of FIG. 14, a second ILD layer 126 is formed over the first ILD layer 118. A third ILD layer 1402 is formed over the second ILD layer 126. In some embodiments, the above layers and/or structures may be formed using a deposition process such as, for example, chemical vapor deposition (CVD), physical vapor deposition (PVD), some other suitable deposition process(es), or any combination of the foregoing. In further embodiments, after forming the second ILD layer 126, a CMP process and/or a polishing process is performed on the second ILD layer 126 to smooth and/or flatten a top surface of the second ILD layer 126.

Figure 15:
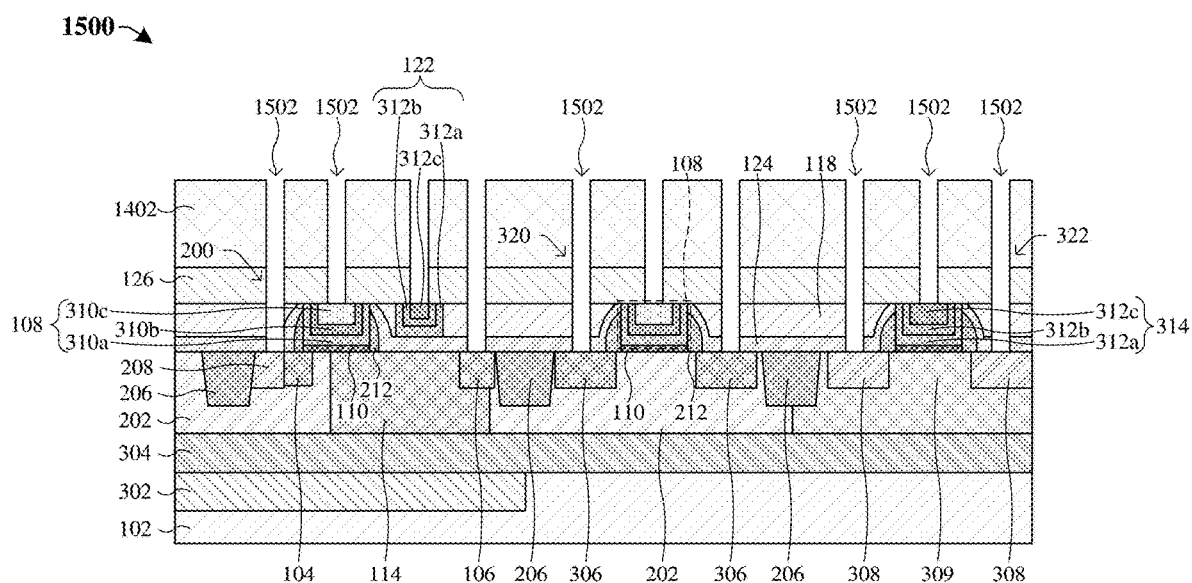

As shown in cross-sectional view 1500 of FIG. 15, the first, second, third ILD layers 118, 126, 1402 and etch stop layer 124 are patterned, thereby defining a plurality of via openings 1502. In some embodiments, the patterning is performed by forming a masking layer (not shown) over the third ILD layer 1402, exposing the third ILD layer 1402 to one or more etchants according to the masking layer, and removing the masking layer. In the aforementioned embodiment, the patterning process comprises a plasma etch process, such that the field plate 122 protects the underlying drift region 114 from damage due to the plasma etch process.

Figure 16:
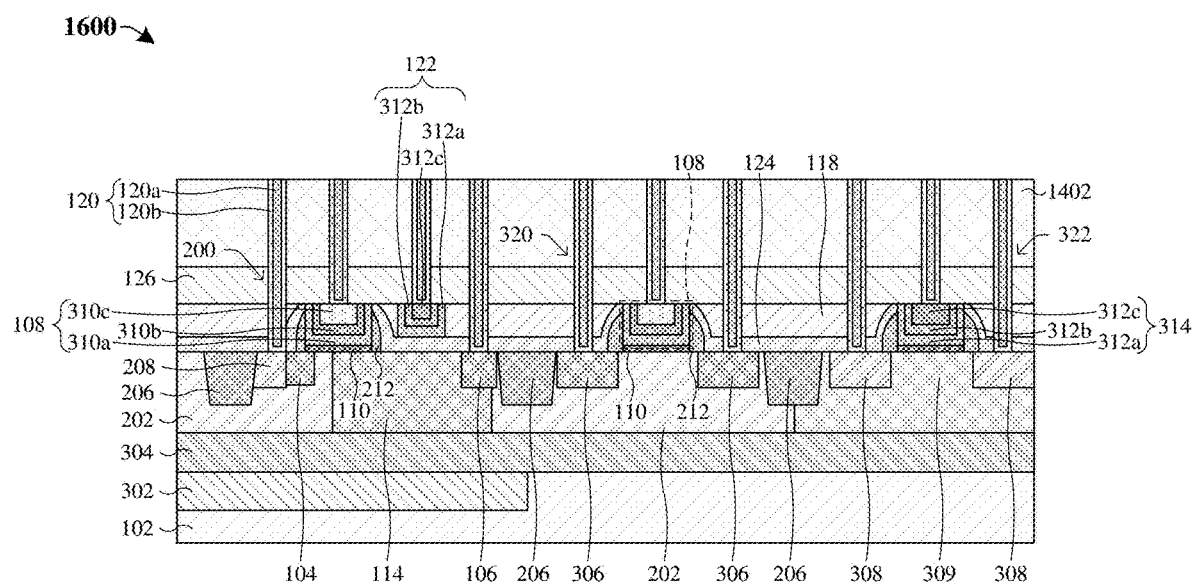

As shown in cross-sectional view 1600 of FIG. 16, a plurality of contacts 120 are formed in the via openings (1502 of FIG. 15). In some embodiments, a method for forming the contacts 120 includes: lining the via openings (1502 of FIG. 15) with a conductive adhesion layer (e.g., comprising titanium, nitride, titanium nitride, or the like), filling a remaining portion of each via opening (1502 of FIG. 15) with a conductive layer (e.g., tungsten), and performing a CMP process into the conductive adhesion layer and the conductive layer until an upper surface of the third ILD layer 1402 is exposed. The contacts 120 respectively comprise an inner conductive body 120a surrounded by an outer conductive body 120b. In some embodiments, the inner conductive body 120a comprises a same material as the conductive layer (e.g., tungsten) and the outer conductive body 120b comprises another same material as the conductive adhesion layer (e.g., titanium, nitride, titanium nitride). In further embodiments, after forming the contacts 120, an interconnect structure comprising a plurality of conductive vias and conductive wires is formed over the structure of FIG. 16 (not shown).

Figure 17:
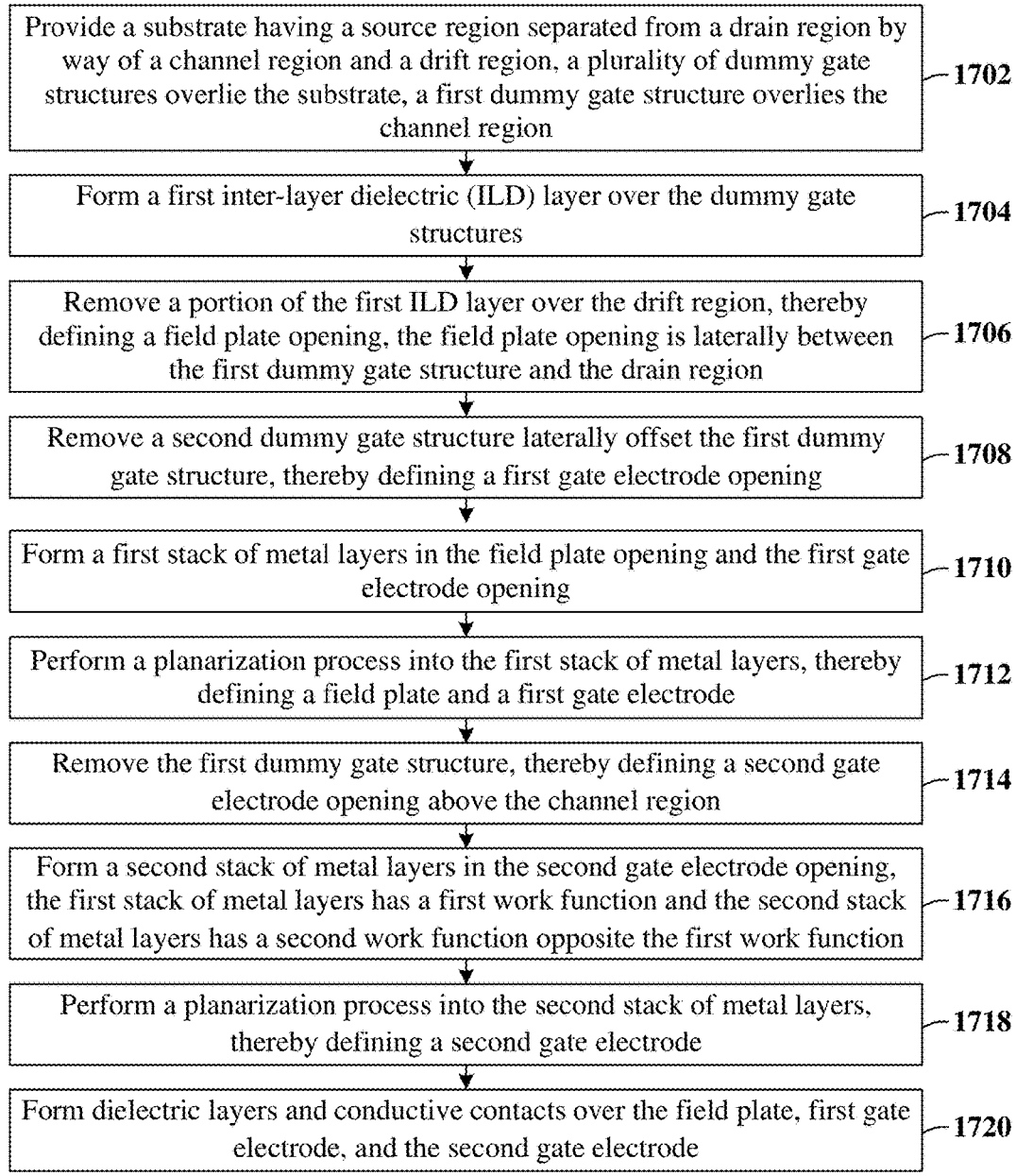
FIG. 17 illustrates a methodology in flowchart format that illustrates some embodiments of a method of forming a high voltage LDMOS device having a field plate.

FIG. 17 illustrates a method 1700 of forming a high voltage LDMOS device having a field plate according to the present disclosure. Although the method 1700 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1702, a substrate having a source region separated from a drain region by way of a channel region and a drift region is provided. A plurality of dummy gate structures overlie the substrate, such that a first dummy gate structure overlies the channel region. FIG. 4 illustrates a cross-sectional view 400 corresponding to some embodiments of act 1702.

At act 1704, a first inter-level dielectric (ILD) layer is formed over the dummy gate structures. FIG. 4 illustrates a cross-sectional view 400 corresponding to some embodiments of act 1704.

At act 1706, a portion of the first ILD layer is removed over the drift region, thereby defining a field plate opening. The field plate opening is laterally between the first dummy gate structure and the drain region. FIG. 7 illustrates a cross-sectional view 700 corresponding to some embodiments of act 1706.

At act 1708, a second dummy gate structure laterally offset the first dummy gate structure is removed, thereby defining a first gate electrode opening. FIG. 8 illustrates a cross-sectional view 800 corresponding to some embodiments of act 1708.

At act 1710, a first stack of metal layers is formed in the field plate opening and the first gate electrode opening. FIG. 9 illustrates a cross-sectional view 900 corresponding to some embodiments of act 1710.

At act 1712, a planarization process is performed into the first stack of metal layers, thereby defining a field plate and a first gate electrode. FIG. 10 illustrates a cross-sectional view 1000 corresponding to some embodiments of act 1712.

At act 1714, the first dummy gate structure is removed, thereby defining a second gate electrode opening above the channel region. FIG. 11 illustrates a cross-sectional view 1100 corresponding to some embodiments of act 1714.

At act 1716, a second stack of metal layers is formed in the second gate electrode opening. The first stack of metal layers has a first work function and the second stack of metal layers has a second word function opposite the first work function. FIG. 12 illustrates a cross-sectional view 1200 corresponding to some embodiments of act 1716.

At act 1718, a planarization process is performed into the second stack of metal layers, thereby defining a second gate electrode. FIG. 13 illustrates a cross-sectional view 1300 corresponding to some embodiments of act 1718.

At act 1720, dielectric layers and conductive contacts are formed over the field plate, first gate electrode, and the second gate electrode. FIGS. 14-16 illustrate cross-sectional views 1400-1600 corresponding to some embodiments of act 1720.

Accordingly, in some embodiments, the present disclosure relates to a high voltage device having a field plate that is formed concurrent with a formation of a gate electrode to enable a low-cost method of fabrication and decrease a breakdown voltage of the high voltage device.

In some embodiments, the present application provides an integrated chip including a first gate electrode overlying a substrate between a source region and a drain region; an etch stop layer laterally extending from an outer sidewall of the first gate electrode to the drain region, wherein the etch stop layer overlies a drift region disposed between the source region and the drain region; and a field plate disposed within a first inter-level dielectric (ILD) layer overlying the substrate, the field plate overlies the drift region, a top surface of the field plate is aligned with a top surface of the first gate electrode and a bottom surface of the field plate is vertically above a bottom surface of the first gate electrode, wherein the field plate and first gate electrode respectively include metal materials.

In some embodiments, the present application provides a high voltage device including a laterally diffused metal-oxide semiconductor field-effect transistor (MOSFET) (LDMOS) device including a first gate structure overlying a substrate, and further including a source region, drain region, and diffusion region disposed in the substrate, wherein the diffusion region is disposed laterally between the source region and the drain region, wherein the first gate structure includes a first gate electrode including first conductive materials having a first work function; a first transistor including a second gate structure overlying the substrate, and further including second source/drain regions disposed on opposing sides of the second gate structure, wherein the second gate structure includes a second gate electrode including second conductive materials having a second work function different than the first work function; and a field plate overlying the diffusion region laterally disposed between the first gate electrode and the drain region, wherein the field plate includes the second conductive materials.

In some embodiments, the present application provides a method for forming a high voltage transistor device including providing a substrate having a source region separated from a drain region by way of a channel region and a drift region, a plurality of dummy gate structures overlie the substrate, wherein a first dummy gate structure overlies the channel region; forming a first inter-level dielectric (ILD) layer over the plurality of dummy gate structures; removing a portion of the first ILD layer over the drift region, thereby defining a field plate opening, wherein the field plate opening is laterally between the first dummy gate structure and the drain region; removing a second dummy gate structure laterally offset the first dummy gate structure, thereby defining a first gate electrode opening; forming a first stack of metal layers in the field plate opening and the first gate electrode opening; and performing a planarization process into the first stack of metal layers, thereby defining a field plate and a first gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, comprising:
   forming a source region and a drain region within a substrate;
   forming a drift region within the substrate, wherein the drift region is disposed laterally between the source region and the drain region;
   forming a first gate structure over the drift region;
   forming an inter-level dielectric (ILD) layer over the first gate structure;
   patterning the ILD layer to define a field plate opening;
   forming a first field plate layer, a second field plate layer, and a third field plate layer within the field plate opening; and
   performing a planarization process along a top surface of the ILD layer, wherein the planarization process removes excess of the first, second, and third field plate layers over the ILD layer, thereby defining a field plate.

2. The method of claim 1, wherein the first field plate layer contacts sidewalls of the ILD layer that define the field plate opening, the second field plate layer is disposed between opposing sidewalls of the first field plate layer, and the third field plate layer is disposed between opposing sidewalls of the second field plate layer.

3. The method of claim 2, wherein the first and second field plate layers are respectively U-shaped, and the first field plate layer cups the second field plate layer.

4. The method of claim 1, further comprising:
   forming an etch stop layer over the substrate, wherein the etch stop layer extends along opposing sidewalls of the first gate structure, wherein the etch stop layer is disposed between the ILD layer and the substrate.

5. The method of claim 4, further comprising:
   patterning the etch stop layer to form the field plate opening, wherein the field plate opening is defined by sidewalls of the ILD layer and sidewalls of the etch stop layer.

6. The method of claim 1, further comprising:
   forming a second gate structure over the substrate, wherein the second gate structure comprises the first, second, and third field plate layers.

7. The method of claim 6, wherein the first gate structure comprises a gate electrode comprising first conductive materials having a first work function, wherein the first, second, and third field plate layers comprise second conductive materials having a second work function different from the first work function.

8. The method of claim 1, wherein the top surface of ILD layer is coplanar with a top surface of the field plate.

9. A method for forming a high voltage transistor device, comprising:
   providing a substrate having a source region separated from a drain region by a channel region and a drift region, a plurality of dummy gate structures overlies the substrate, wherein a first dummy gate structure overlies the channel region;
   forming a first inter-level dielectric (ILD) layer over the plurality of dummy gate structures;
   removing a portion of the first ILD layer over the drift region, thereby defining a field plate opening, wherein the field plate opening is laterally between the first dummy gate structure and the drain region;
   removing a second dummy gate structure laterally offset the first dummy gate structure, thereby defining a first gate electrode opening;
   forming a first stack of metal layers in the field plate opening and the first gate electrode opening; and performing a planarization process into the first stack of metal layers, thereby defining a field plate and a first gate electrode.

10. The method of claim 9, wherein the field plate and the first gate electrode are formed concurrently.

11. The method of claim 9, further comprising:
removing the first dummy gate structure, thereby defining a second gate electrode opening above the channel region;
forming a second stack of metal layers in the second gate electrode opening, wherein the first stack of metal layers has a first work function and the second stack of metal layers has a second work function opposite the first work function; and
performing a second planarization process into the second stack of metal layers, thereby defining a second gate electrode.

12. The method of claim 11, wherein the first work function is a p-type work function and the second work function is an n-type work function.

13. The method of claim 9, wherein a masking layer is disposed within the field plate opening while removing the second dummy gate structure.

14. The method of claim 9, wherein forming the first stack of metal layers comprises:
forming a first field plate layer over the first ILD layer;
forming a second field plate layer over the first field plate layer; and
forming a third field plate layer over the second field plate layer, wherein the first, second, and third field plate layers respectively continuously extend from the field plate opening to the first gate electrode opening.

15. The method of claim 14, wherein the first and second field plate layers are respectively U-shaped within the field plate opening and the first gate electrode opening.

16. The method of claim 15, wherein the planarization process removes excess of the first, second, and third field plate layers over the first ILD layer.

17. A method for forming a high voltage transistor device, comprising:
providing a substrate having a source region separated from a drain region, a first dummy gate structure and a second dummy gate structure overlies the substrate, wherein the first dummy gate structure is disposed laterally between the source region and the drain region;
forming an etch stop layer over the substrate;
forming an inter-level dielectric (ILD) layer over the etch stop layer;
patterning the ILD layer to define a field plate opening within the ILD layer, wherein the field plate opening is disposed laterally between the first dummy gate structure and the drain region;
removing the second dummy gate structure to define a first gate electrode opening;
forming a field plate within the field plate opening;
forming a first gate electrode within the first gate electrode opening, wherein the field plate and the first gate electrode are formed concurrently;
removing the first dummy gate structure to define a second gate electrode opening; and
forming a second gate electrode within the second gate electrode opening.

18. The method of claim 17, wherein the first gate electrode comprises first conductive materials having a first work function, and wherein the second gate electrode comprises second conductive materials having a second work function different from the first work function.

19. The method of claim 17, wherein forming the first gate electrode and the field plate comprises:
forming a first field plate layer over the substrate;
forming a second field plate layer over the first field plate layer;
forming a third field plate layer over the second field plate layer, wherein the first, second, and third field plate layers fill the first gate electrode opening and the field plate opening; and
performing a first planarization process on the first, second, and third field plate layers.

20. The method of claim 19, wherein forming the second gate electrode comprises:
forming a first gate electrode layer over the ILD layer;
forming a second gate electrode layer over the first gate electrode layer;
forming a third gate electrode layer over the second gate electrode layer, wherein the first, second, and third gate electrode layers continuously extend over an upper surface of the ILD layer to an upper surface of the field plate and an upper surface of the first gate electrode; and
performing a second planarization process on the first, second, and third gate electrode layers.

* * * * *